US006664126B1

(12) United States Patent
Devoe et al.

(10) Patent No.: US 6,664,126 B1
(45) Date of Patent: Dec. 16, 2003

(54) PROCESS FOR FABRICATION OF 3-DIMENSIONAL MICROMECHANISMS

(75) Inventors: Donald Lad Devoe, Bethesda, MD (US); Lung-Wen Tsai, Riverside, CA (US)

(73) Assignee: University of Maryland, College Park, Riverdale, MD (US)

(*) Notice: Subject to any disclaimer, the term of this patent is extended or adjusted under 35 U.S.C. 154(b) by 89 days.

(21) Appl. No.: 10/069,616

(22) PCT Filed: Sep. 1, 2000

(86) PCT No.: PCT/US00/20811
§ 371 (c)(1),
(2), (4) Date: Feb. 27, 2002

(87) PCT Pub. No.: WO01/18857
PCT Pub. Date: Mar. 15, 2001

Related U.S. Application Data

(60) Provisional application No. 60/152,463, filed on Sep. 3, 1999.

(51) Int. Cl.[7] .................... H01L 21/00; H01L 21/30; H01L 21/46; H02N 1/00
(52) U.S. Cl. .................. 438/50; 438/455; 310/40 MM; 310/309
(58) Field of Search ............... 438/50, 51, 52, 438/53, 455, 456, 457, 458, 459; 310/40 MM, 309

(56) References Cited

U.S. PATENT DOCUMENTS

| | | | | | |
|---|---|---|---|---|---|
| 5,006,487 A | * | 4/1991 | Stokes | ............... | 437/228 |
| 5,216,273 A | * | 6/1993 | Doering et al. | ............. | 257/419 |
| 5,576,483 A | * | 11/1996 | Bonin | .................. | 73/105 |
| 5,589,082 A | * | 12/1996 | Lin et al. | ................. | 216/2 |
| 5,614,742 A | * | 3/1997 | Gessner et al. | ............. | 257/254 |
| 5,959,206 A | * | 9/1999 | Ryrko et al. | ............. | 73/504.12 |
| 6,040,935 A | * | 3/2000 | Michalicek | ............... | 359/198 |

* cited by examiner

Primary Examiner—John F. Niebling
Assistant Examiner—Viktor Simkovic
(74) Attorney, Agent, or Firm—Rosenberg, Klein & Lee

(57) ABSTRACT

This invention provides a fabrication process for manufacturing of truly 3-dimensional micromechanisms which takes advantages of SOI (silicon-on-insulator) wafers each of which is processed to create a respective structural element of the 3-dimensional micromechanisms by DRIE (deep reactive ion etching) of the wafer and thermal oxidation of the trenches opened during the DRIE etching. The wafers are sequentially bonded into a multistack structure from which the 3-D micromechanism. is released by XeF$_2$ etching. Thermally grown SiO$_2$ is used as structural material for the 3-D micromechanism.

20 Claims, 12 Drawing Sheets

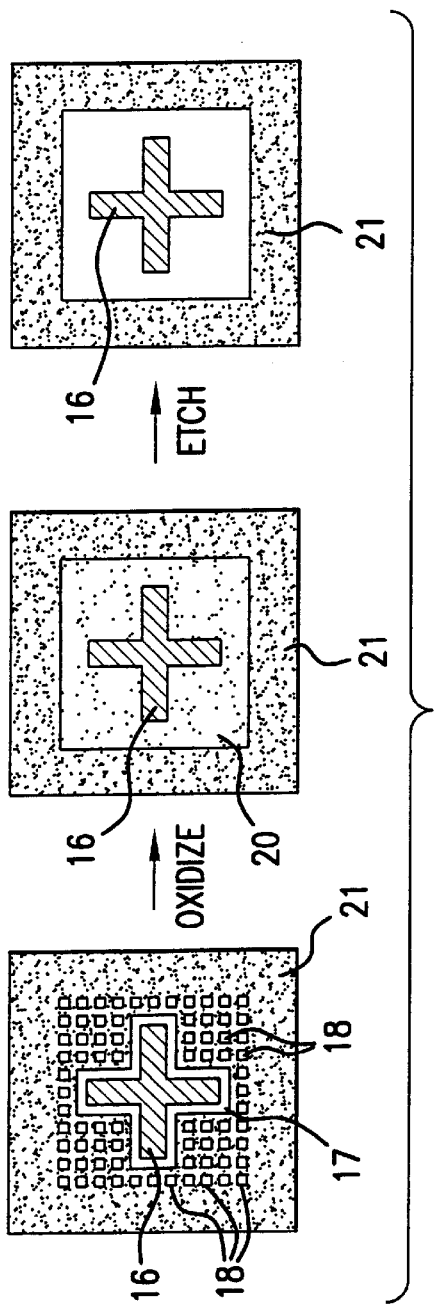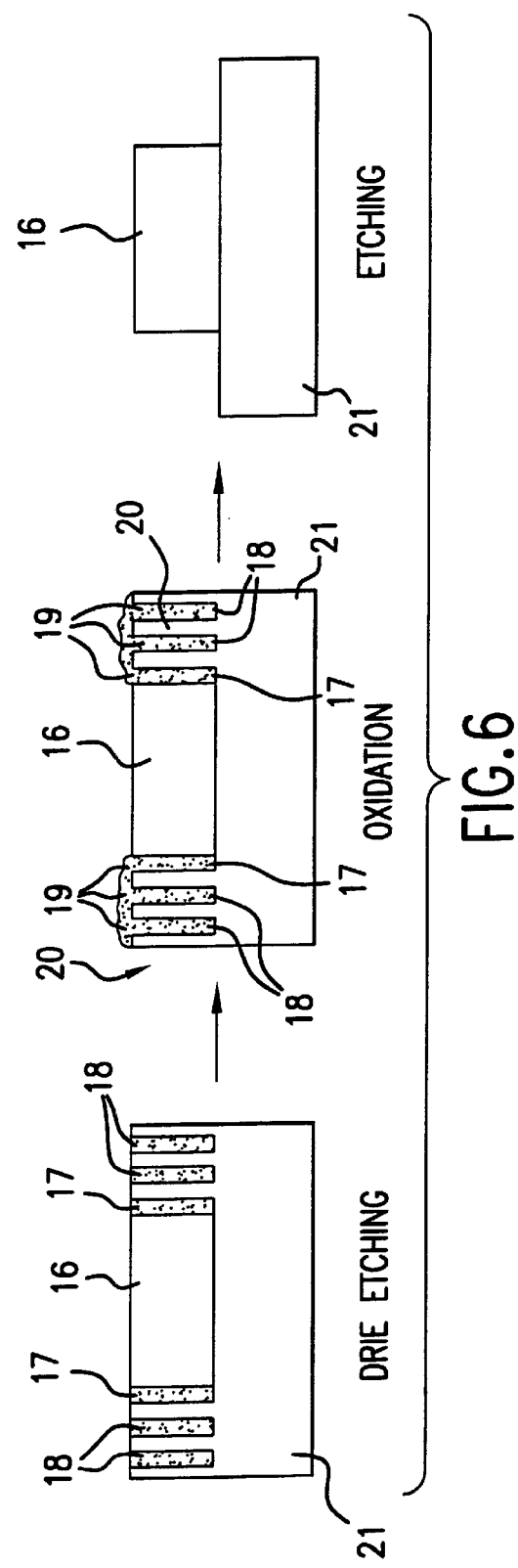
FIG.5
FIG.6

PROCESS FOR FABRICATION OF 3-DIMENSIONAL MICROMECHANISMS

REFERENCE TO RELATED APPLICATION

The patent application is based upon U.S. Provisional Patent Application Ser. No. 60/152,463, filed on Sep. 3, 1999.

FIELD OF THE INVENTION

The present invention relates to the field of micromechanisms. Particularly this invention pertains to the fabrication of 3-dimensional micromechanisms such as micromanipulators, microfluidic valves, actuators and end effectors for milli- and micro-robotic applications, precision data head manipulator for high density data storage, positioners for microphotonic systems, and other systems used in the field of micromechanisms.

More particularly, the present invention relates to a fabrication process for creating 3-dimensional micromechanisms in parallel fashion without need for post processing assembly.

Further, the present invention relates to the fabrication of 3-dimensional micromechanisms in which respective portions of a 3-dimensional micromechanism are created in separate wafers which are bonded together in sequence to form a final product (3-dimensional micromechanism) which may include variety of structural elements, such as: actuators, platforms, links, embedded joints coupled between the structural elements of the 3-dimensional micromechanisms such as linear sliders, ball-in-socket structures, overhanging or enclosed components, as well as other elements useful in this field.

Furthermore, the present invention relates to the fabrication of 3-dimensional micromechanisms based on thermally grown $SiO_2$ as a material for structural elements of the micromechanisms.

BACKGROUND OF THE INVENTION

As the miniaturization technology of complex engineering systems accelerates, the need for high-precision micromechanisms is becoming increasingly evident. For example, NASA predicts that the next generation of miniaturized spacecrafts will require micro-scale mechanisms for the deployment and manipulation of structures such as antennas, solar sails, and telescopes.

Such small-scale mechanisms will require dramatic reductions in size and weight over current technology. Typically, a Micro Electro Mechanical System (MEMS), such as a three-degree-of-freedom silicon-based platform manipulator, employs a combination of prismatic and pseudo-revolute kinematic pairs to achieve functionality. Micromanipulators include a moving platform, operatively connected to actuators through respective links. The moving platform and the actuators are coupled to the links through different joints. The controlled movement of the actuators is conveyed through the links to the moving platform and thus drives the platform in a predetermined direction through a predetermined distance. The dimensions of such a micromanipulator ranges from several microns to thousands of microns.

Silicon-based micromechanisms are manufactured using a variety of manufacturing techniques. Many of these technologies, such as LIGA, DRIE (deep reactive ion etching), and laser etching, result in simple extrusions of 2-dimensional planar structures. Some methods which are capable of generating true 3-dimensional microstructures, such as component bonding and hinged structure fabrication, require manual assembly and are not well suited for low-cost, mass-produced micromechanisms. Techniques such as micro stereo lithography and focused laser/ion beam deposition are not parallel processes and thus are not cost-effective technologies. In addition, many of these techniques, such as hinged structure fabrication, rely on thin film technology. and thus cannot produce mechanically-robust mechanisms capable of interfacing with macro-scale forces.

Existing 3-D micromachined structures may be loosely categorized as belonging to one of three groups: serially-processed microstructures, assembled microstructures, and parallel-processed microstructures.

Serially-processed microstructures, produced by techniques such as laser or focused ion beam etching and deposition, have been developed by leveraging from existing technologies used for performing modifications and corrections to fabricated VLSI (very large scale integration) circuits. Gas-assisted laser etching techniques used for high-aspect-ratio milling, and localized ion-beam-induced deposition has been demonstrated viable for 3D micromechanical structures. Other serial techniques based on non-IC processing have also been successfully used. As an example, stereo lithography systems, commercially applied to macro-scale desktop prototyping has recently been adapted to the microfabrication of polymer and plated metal structures with dimensions as low as 5 μm.

While these techniques offer significant design flexibility for producing arbitrary 3-D shapes on the microscale level, they must be fabricated one device at a time resulting in high manufacturing costs and limiting their application for mass-produced devices. Additionally, the range of dimensions (both in-plane and out-of-plane) which can be achieved by these techniques are limited by relatively slow processing speeds.

Assembled microstructures which employ parallel fabrication processes to form mechanical components to be later hand-assembled, have been successfully demonstrated. Simple pick-and-place of high-aspect-ratio electroplated microcomponents produced by LIGA methods has been used to produce a variety of 3-D structures with large x-y-z dimensional range. Bonding methods provide additional flexibility by allowing selected components to be "welded" into place after assembly. Hinged structures have proven very successful for a variety of applications.

An important capability of assembly processes is the potential for producing freestanding structures such as hub-and-axle assemblies. However, due to the nature of the assembly process, they cannot achieve complex structures such as ball-and-socket devices. Additionally, these methods require meticulous hand assembly of individual components, and as such are not considered truly parallel processes. The additional costs required for final assembly of these 3-D structures makes them prohibitively expensive for most applications.

Parallel processes offer great potential for low cost, mass-produced microstructures with 3-D geometries. Bulk-etched silicon devices fabricated using isotropic and anisotropic wet etchants together with etch-stop techniques have been thoroughly explored over in recent times. Bulk-etching techniques are capable of producing devices with large dimensional ranges, both in- and out-of the wafer plane, but are extremely limited in the types of geometries which can be achieved. Fabrication techniques capable of producing high-aspect-ratio structures, such as LIGA and deep-RIE of silicon are capable of generating arbitrary in-plane geometries however, out-of-plane dimensions are limited to simple extrusions of the in-plane structures.

Thus although significant progress has been made in fabrication of planar micromachined mechanisms, current manufacturing technology still results in fragile structures which cannot survive typical macro-scale loading conditions. There remains a strong need for fabrication technology capable of producing fully 3-dimensional micromechanisms which are mechanically robust enough to couple macro-scale forces and disturbances with precise micro-scale motions.

The ability to produce true 3-dimensional micromechanisms in a parallel fabrication technology while eliminating the post-processing assembly is a long standing need in the art.

SUMMARY OF THE INVENTION

It is, therefore, an object of the present invention to provide a fully parallel process which permits production of true 3-dimensional micromechanisms of nearly arbitrary in plane and out-of-plane shapes.

It is another object of the present invention to provide a process for 3-dimensional microstructures manufacturing which does not need a post-processing assembly, thus enabling the development of extremely complex 3-D micromechanisms in a relatively low-cost, high volume and less time consuming fashion.

It is a further object of the present invention to provide parallel microfabrication technology for producing silicon based 3-dimensional Micro-Electro-Mechanical Systems (3DMEMS's) capable of achieving out-of-wafer dimensions much larger than traditional surface micromachined structures. This concept permits the manufacture of arbitrary planar shapes and kinematic pairs, such as linear sliders (e.g., pistons), ball-in-socket structures, and similar overhanging or enclosed components.

It is still another object of the present invention to provide a 3-D MEMS fabrication process which allows for the integration of both VLSI circuitry and traditional surface-micromachined devices without resorting to two-chip solutions such as solder bump attach or multi-chip modules.

It is a further object of the present invention to provide a fabrication process for manufacturing of mechanically-robust 3-D micromechanisms, microfluidic components, actuators and end-effectors for milli- and micro-robotic applications, precision data head manipulation for high density data storage, and positioners for microphotonic systems capable of large displacements and precise motion in three dimensions.

The 3-dimensional Micro Electro Mechanical system (3DMEMS) manufacturing process, is a novel technique for the fabrication of true 3-dimensional microstructures. It is a fully parallel microfabrication process which is compatible with backend processing for both CMOS fabrication and polysilicon micromachining. The fabrication technique of the present invention permits a low-cost mass-production of truly 3-dimensional MicroElectroMechanical systems (MEMS) components with planar dimensions as small as 4 $\mu$m, and out-of-plane dimensions ranging from approximately 5 microns to several thousand microns. The 3DMEMS process allows for the production of mechanically-robust, multi-level devices with partially and fully enclosed components, such as ball joints and pistons, in a parallel fabrication flow. Additionally, the technology supports the integration of CMOS circuitry and traditional polysilicon MEMS structures at the top level of the mechanisms, resulting in complete 3-dimensional Microsystems.

In accordance with the teachings of the present invention, the 3DMEMS process employs several micromachining techniques, including the use of silicon-on-insulator (SOI) substrate wafers, deep reactive ion etching. (DRIE) of bulk silicon, chemical-mechanical polishing (CMP) of silicon wafer surfaces, silicon wafer bonding, and xenon difluoride ($XeF_2$) gas-phase silicon etching.

The 3-dimensional structures are produced in successive layers, wherein in each layer a respective portion of a 3-D micromechanism is created to be further fusion bonded to other portions of the 3-D micromechanism formed in other layers. In this manner, in a first SOI wafer layer, a respective structural element of the 3-D micromechanism is made by defining this portion by the $SiO_2$ which is thermally grown in channels etched via DRIE in the SOI substrate. When the oxidation of this first layer is complete, the surface is smoothed by CMP (chemical-mechanical polishing), and a next SOI wafer is hydrophobically bonded to the newly smoothed surface. This new substrate wafer is thinned to the desired thickness by another CMP step, and the next layer is etched via DRIE to make the next structural element of the 3-D micromechanism. Substantially thermal oxidation is performed to contour the next structural element of the 3-D micromechanism by $SiO_2$.

When all the layers have been processed, backend CMOS fabrication and surface micromachining may be performed, followed by photoresist passivation and $XeF_2$ etching to remove the exposed silicon which leaves the desired $SiO_2$ blocks and selected silicon structures.

While this technique is conceptually simple, a variety of extremely complicated 3-dimensional structures may be produced in this manner. For example, devices which can be fabricated include planar, revolute, and spherical joints, gear-and-cog systems with combined vertical and horizontal rotational axes, and passageways (cylinders) with enclosed pistons for hydraulic or pneumatic actuation, as well as other elements useful in this field.

These and other novel features and advantages of this invention will be fully understood from the following Detailed Description of the accompanying drawings.

BRIEF DESCRIPTION OF THE DRAWINGS

FIG. 5 is a plan view showing schematically the steps of creating arbitrary in-plane structures in each layer via DRIE-oxidation process;

FIG. 6 is a side view of the structures created in each waffle in accordance with the steps of FIG. 5;

DETAILED DESCRIPTION OF THE PREFERRED EMBODIMENT

Figure 1:
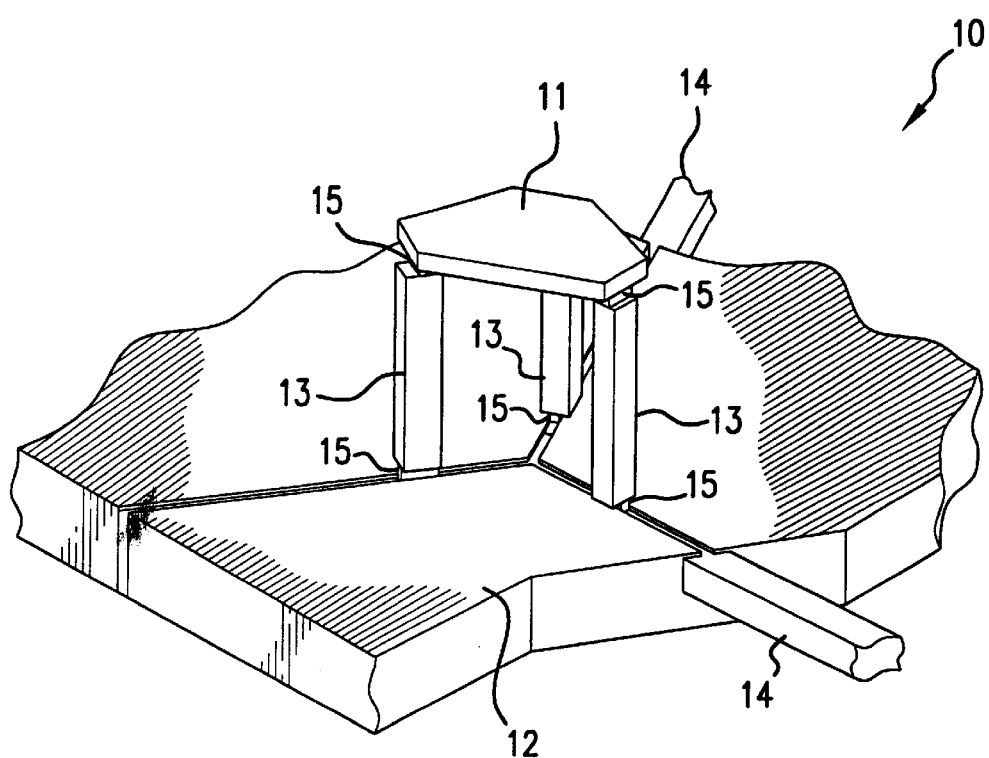
FIG. 1 is a perspective view of a platform micromanipulator.
Figure 2:
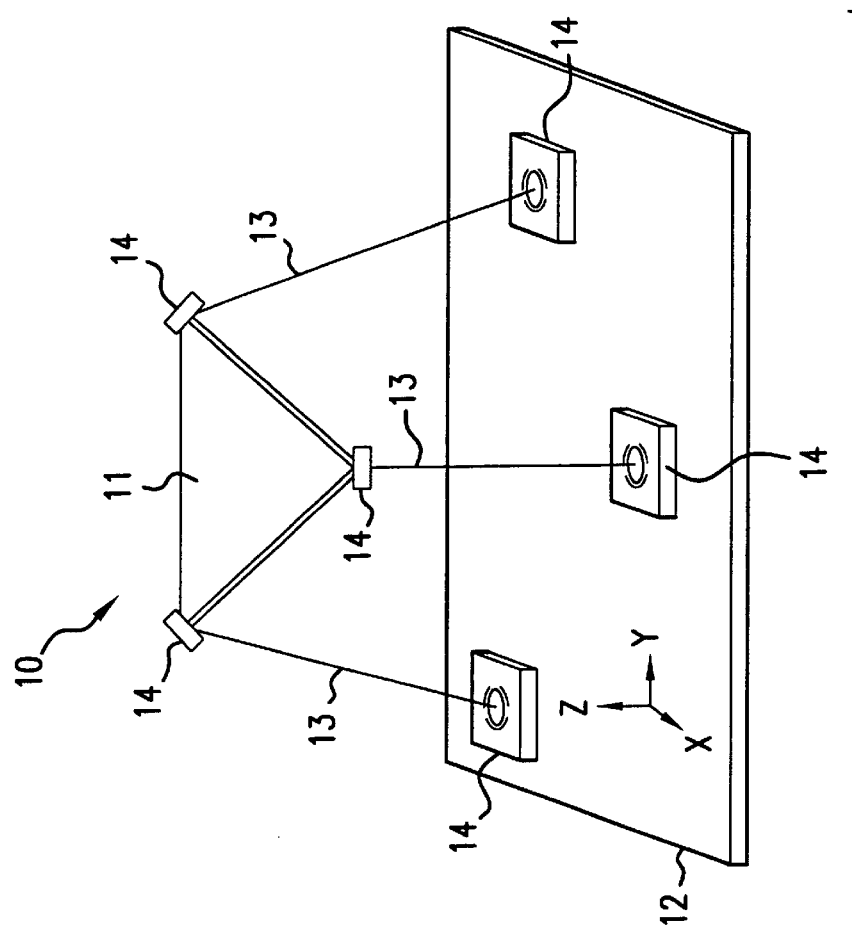
FIG. 2 schematically depicts examples of micromechanism configurations with embedded kinematic pairs which may be fabricated with the process of the present invention.
Figure 2:
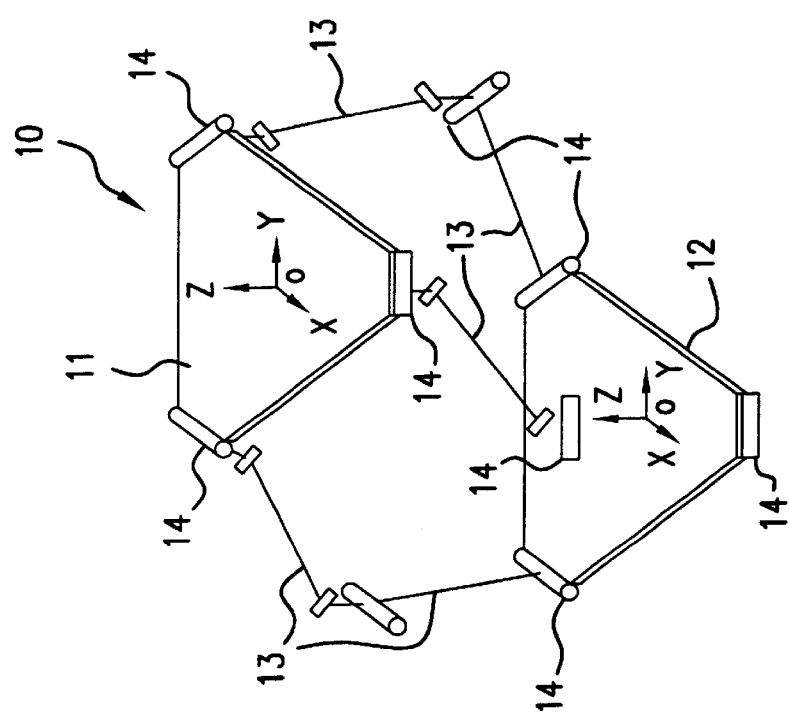

Micromechanisms produced in the 3DMEMS (3-dimensional micro-electro-mechanical system) process of the present invention have broad applications for microactuation tasks where mechanical robustness, large displacements in three dimensions, precise motions, and integrated MEMS and VLSI are desired. These micromechanisms include microfluidic systems, mechanically-robust mechanisms for coupling multi-axis micro-scale motion with macro-scale forces, actuators and end-effector for milli- and micro-robotic applications, precision data head manipulation for high-density data storage, and positioners for microphotonic systems. As an example, the process of the present invention makes possible the mass-production of 3-dimensional 6 DOF micromanipulators also known as spatial parallel manipulators, or platform micromechanisms, the perspective view of which is illustrated in FIG. 1, and schematic representation of which is depicted in FIG. 2.

The platform micromechanism consists of a moving platform 11 which is connected to a fixed base 12 by several limbs 13. The moving platform 10 is used as an end-effector. Generally, the number of limbs is equal to the number of degrees of freedom. Each limb is controlled by one actuator 14 such that external load can be shared by all actuators.

Figure 3:
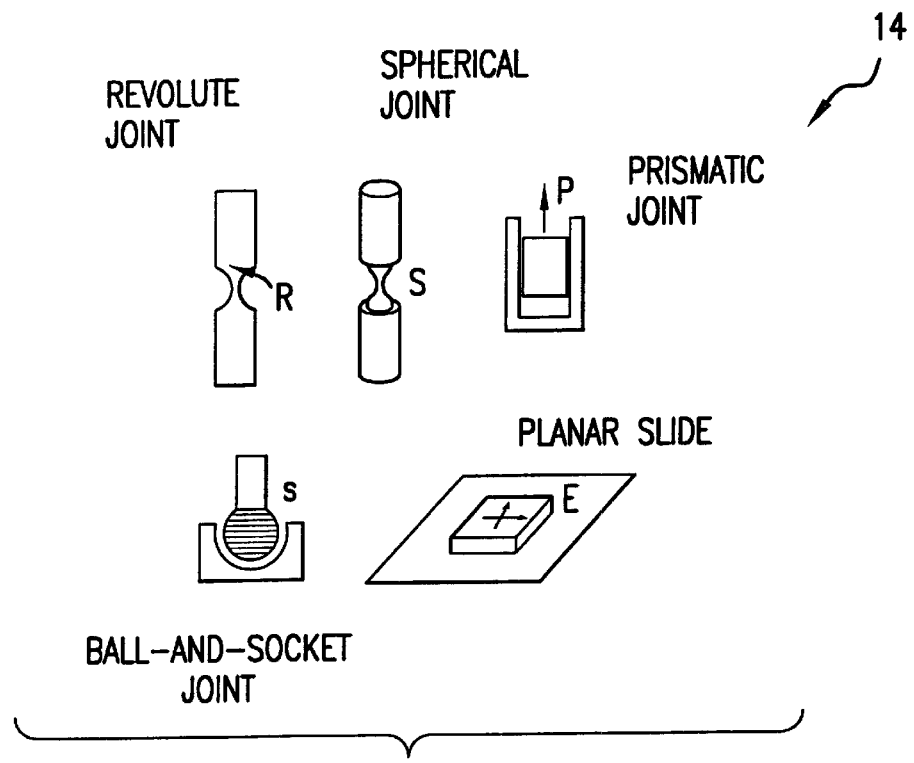
FIG. 3 schematically depicts typical kinematic pairs which may be microfabricated by the process of the present invention.
Figure 4:
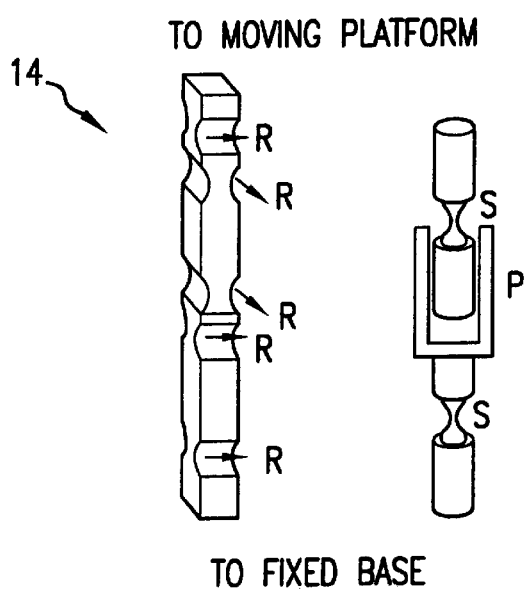
FIG. 4 is a schematic representation of kinematic chains which may be microfabricated by the process of the present invention.

The micromechanisms 10 employ a combination of compliant and non-compliant kinematic pairs which serve as joints 15 between the moving platform 11 and the limbs 13, as well as between the actuators 14 and the limbs 13. The most commonly used joints shown in FIG. 3, are revolute, prismatic, ball-and-socket spherical, and planar sliders. An important advantage associated with the fabrication techniques of the present invention is that multiple joints with different operational axes can be produced in a single integrated process. Additionally, kinematic chains shown in FIG. 4 can be produced by the micromachining technique of the present invention.

The micromanipulators 10 may be used as small-motion devices positioned between the terminal link of a robotic arm and end-effector, or between a gimbal-less disk drive arm and read-write head or STM (scanning tunneling microscopy) tip. Such a micromanipulator would provide an additional layer of control for the end-effector or read-write head, permitting high-band-width with high-resolution motion.

Additionally, since VLSI electronics and polysilicon MEMS structures may be integrated onto the 6 DOF actuator, the end-effector (platform) itself may be produced in-situ with the actuator. In this case, the end-effector may be an electrostatic or thermal microgripper, a resonant sensor for measuring properties of materials in contact with the end-effector, a passive infrared array for performing high-resolution localized thermal mapping, or an MR element for data storage. In each case, the 3-dimensional microsystem is produced by the process of the present invention in a fully parallel, integrated manner which requires no post-fabrication assembly.

Actuation of the micromanipulator may be accomplished through the use of a set of prismatic joints 15 integrated onto the base joint of each manipulator limb 13. These joints may be connected to on- or off-chip actuators. In addition to the aforesaid applications of the micromanipulator manufactured by the subject fabrication process, they may be used as:

High-precision medical microrobot end effector with integrated sensing elements.

Arrays of large-displacement microactuators for automated parts positioning.

Arrays of large-displacement microactuators for material transport, i.e., a micro-conveyor belt.

Arrays of high-force large-displacement microactuators for active/deformable aerospace skin, especially suited for micro UAV applications.

Manipulators for microassembly.

Microfluidic systems (3-dimensional chambers, multi-level passageways and interconnects).

Large-displacement enclosed components for microfluidics, such as free-standing microfluidic check valves or gate valves and hydraulic/pneumatic micropistons.

Data storage (3-dimensional large-displacement micropositioning, e.g., for STM tips).

Microphotonic systems (e.g., large-displacement mirror positioning).

Micro-robot locomotion (micro-millipede) employing arrays of 4-bar linkages as legs and feet.

Gear-and-cog mechanisms with combined vertical and horizontal rotational axes.

The process of the present invention makes it possible to manufacture truly 3-dimensional micromechanisms eliminating the need for post-processing assembly thus enabling fabrication of extremely complex micromechanisms.

The microfabrication technique of the present invention represents a unique approach to micromechanism fabrication. It. is a fully parallel process compatible with back end processing for both CMOS fabrication and polysilicon micromachining. It will enable low-cost mass-production of true 3-dimensional MEMS components with planar dimensions as small as 4 $\mu$m, and out-of-plane dimensions ranging from approximately 5 microns to several thousand microns. The process supports direct integration of. CMOS circuitry as well as traditional surface-micromachined MEMS components on the topmost level of the structure (moving platform). These features permit a new class of mechanically-robust 3-dimensional MEMS devices to be produced which are not achievable by current techniques and thus extends the range of application for MEMS technology in many new areas.

The microfabrication techniques of the present invention is based on the following techniques.:

1. Silicon-on-insulator (SOI) wafers,
2. Deep reactive ion etching (DRIE)/thermal oxidation of bulk silicon,
3. Chemical-mechanical polishing (CMP) of wafer surfaces,
4. Silicon wafer bonding, and
5. Xenon difluoride ($XeF_2$) gas-phase silicon etching.

SOI substrates are silicon wafers which consist of a thin $SiO_2$ layer sandwiched between a bottom Si substrate layer and a top Si process layer. The thickness of the process layer can range from several microns to several hundred microns, depending on the fabrication requirements. Initially developed for high-voltage CMOS applications, SOI wafers offer a convenient starting substrate for the processes as the buried $SiO_2$ layer provides a built-in etch stop for the initial etching step. The oxide layer sits atop a lower silicon substrate, eliminating the need for an additional bonding step to provide the device substrate or handle wafer. Since SOI wafers are available from a number of sources (such as, for instance, SOITEC USA Inc.) at competitive prices they offer a cost-effective solution.

DRIE allows for very high aspect ratio micromachining of silicon by employing a time-multiplexed etch cycle which repeatedly coats the etched sidewalls with an etch-inhibiting polymer based on $C_4F_8$. Aspect ratios of 25:1 are commonly achieved using DRIE, and etch rates above 8 mm/min are typical permitting through-wafer etching.

DRIE is used for etching deep oxidation trenches in the silicon process layer of the SOI substrate that allows for the generation of arbitrary in-plane device geometry. This is in contrast to wet anisotropic silicon etching of traditional microfabricating techniques which limits etching to the <100> family of crystal planes. Control over sidewall geometry and etch depth is also provided by DRIE etching. The trenches etched by DRIE techniques are refilled by $SiO_2$ (by means of thermal oxidation), by using, for example, a 1200 Cwet oxidation furnace.

The process employs thermally-grown silicon dioxide ($SiO_2$) for the structural components. While $SiO_2$ has received some attention as a mechanical material for MEMS applications, its properties have not been studied as extensively as polysilicon, since its use in MEMS devices is typically as a sacrificial layer in surface micromachining. It was shown by the Applicants that thermally-grown $SiO_2$ offers several important characteristics which make it a promising material for mechanical applications, even more so than single crystal silicon or polysilicon for certain applications. For example, the hardness of $SiO_2$ is comparable to that of single crystal silicon, however $SiO_2$ exhibits a higher yield strength and lower conductivity. In addition, $SiO_2$ possesses a significantly lower coefficient of thermal expansion compared to single crystal silicon or polysilicon. This is an important property for high-precision micropositioner applications and kinematic pairs which must maintain a specified mechanical clearance over a large temperature range.

Thermal $SiO_2$ is grown for refill of DRIE trenches since it is effectively impervious to the $XeF_2$ etchant used to release the final 3-dimensional structure (as will be described in further paragraphs) which is demonstrated by the results of the testing shown in Table 1. Thermal $SiO_2$ possesses the required characteristics of ideal selectivity to $XeF_2$, excellent mechanical properties, and high-quality DRIE trench refill capabilities. Thermal $SiO_2$ provides the capability to completely fill wide and deep DRIE trenches. Due to the properties of silicon oxidation, in which approximately 46% of the final film thickness is below the original silicon surface, the oxidation fronts from two adjoining trenches will meet during the oxidation process to form a single continuous $SiO_2$ block between adjacent DRIE trenches while simultaneously refilling the trenches.

Once the trenches are filled, further oxidation of the substrate is prevented in a self-limiting manner. Using this technique, structures with arbitrary in-plane dimensions may be created. Furthermore, after wafer planarization via CMP (as will be described in further paragraphs), there are no gaps in the wafer which could trap contaminant during the CMP process or impede the wafer bonding process.

TABLE 1

Etch Rates of Candidate Refill Materials

| candidate material | $XeF_2$ etch rate ($\mu$m/min) |
| --- | --- |
| Thermal $SiO_2$ | 0 |
| PSG (doped CVD $SiO_2$) | 0.05 |
| LTO (undoped CVD $SiO_2$) | 0 |
| $Si_3N_4$ (LPCVD) | 0 |
| $Si_xN_y$ (low stress, LPCVD) | 0.20 |

The feasibility of thermal oxide refill of DRIE trenches of 4 $\mu$m wide, 50 $\mu$m deep has been demonstrated. When structures wider than 4 $\mu$m are desired, multiple 4 $\mu$m wide trenches may be etched in the substrate with 4 mm spacing between adjacent trenches.

Specifically, as shown in FIGS. 5–6, in order to create an arbitrary in-plane geometry, for example, in the shape of a cross, the desired geometry 16 is "contoured" by a DRIE etched 2 $\mu$m-wide trench 17 extending around the cross-shaped structure 16, and an array of 2 $\mu$m-wide holes 18 is DRIE etched in the unwanted silicon around the cross-shaped structure 16. Upon oxidation, the oxidation fronts 19 from individual DRIE holes 18 and the trench 17 join to form a solid continuous block of $SiO_2$ 20, as best shown in FIG. 6. Oxide structure 20 acts as a matrix material, ensuring that the cross-shaped structure 16 remains fixed in the substrate 21 until final release. This is a critical feature of this process, since multiple wafers containing free-standing structures must be aligned to one another before the release.

After each oxidation, a timed etch in buffered hydrofluoric acid is used to remove the oxide from the wafer surface and to etch several microns down into the exposed oxide trenches. Since the oxide acts purely as a "glue" material to hold the silicon components together during fabrication, exposed oxide may be removed without affecting the process. The purpose of this step is to ensure that no oxide is exposed during the CMP step used to planarize the wafer. Since $SiO_2$ and Si possess different elastic moduli (70 MPa for $SiO_2$ Vs. 110 MPa for Si), the CMP process may result in non-uniform etch rates which will adversely affect surface planarity and wafer bond strength.

CMP of wafer surfaces employs a combination of chemical reaction and mechanical abrasion to produce extremely planar wafer surfaces. CMP is required to planarize wafers before bonding, since wafer bonding requires nanometer-scale RMS surface roughness for acceptable bonding.

Hydrophobic SFB (silicon fusion bonding) provide a method for joining two or more wafers together into a continuous silicon stack. This technology is used in the process in question to create multi-layer devices with each additional layer increasing the degrees of freedom available for micromechanism designs.

The wafer bonding steps are performed using high-temperature silicon-to-silicon hydrophobic fusion bonding techniques. In this approach, the silicon surfaces are made hydrophobic by an extended room-temperature dip in hydrofluoric acid before high-temperature bonding of the wafers. The use of hydrophobic bonding is critical, since interfacial oxide between the silicon layers may allow the hydrofluoric acid release etch to penetrate between the bonded layers. Hydrophobic bonding is also desirable as it has been found to result in stronger bonding forces than hydrophilic bonding.

Xenon difluoride $XeF_2$ used as a gas-phase release etchant provides a gentle release technique which avoids difficulties with stiction and mechanical damage during the final release process to free the 3-dimensional $SiO_2$ structures from the multi-layer formation.

Etching of 8 mm long passageways 4 $\mu$m wide and 50 $\mu$m deep has been found to be feasible without any observed degradation of the thermal oxide etch dams defining the passageway walls. The etch rate is not effected by the passage length which indicates that mass transport of etch products out of the passageway does not interfere with the entering $XeF_2$ gas. In this manner, long, thin, and complicated geometries may be released from the substrate using $XeF_2$ as the release etchant.

The subject process enables the fabrication of devices with kinematic pairs such as planar, revolute, and spherical joints, gear-and-cog systems with combined vertical and horizontal rotational axes, and passageways (cylinders) with enclosed pistons for hydraulic or pneumatic actuation.

Figure 7:
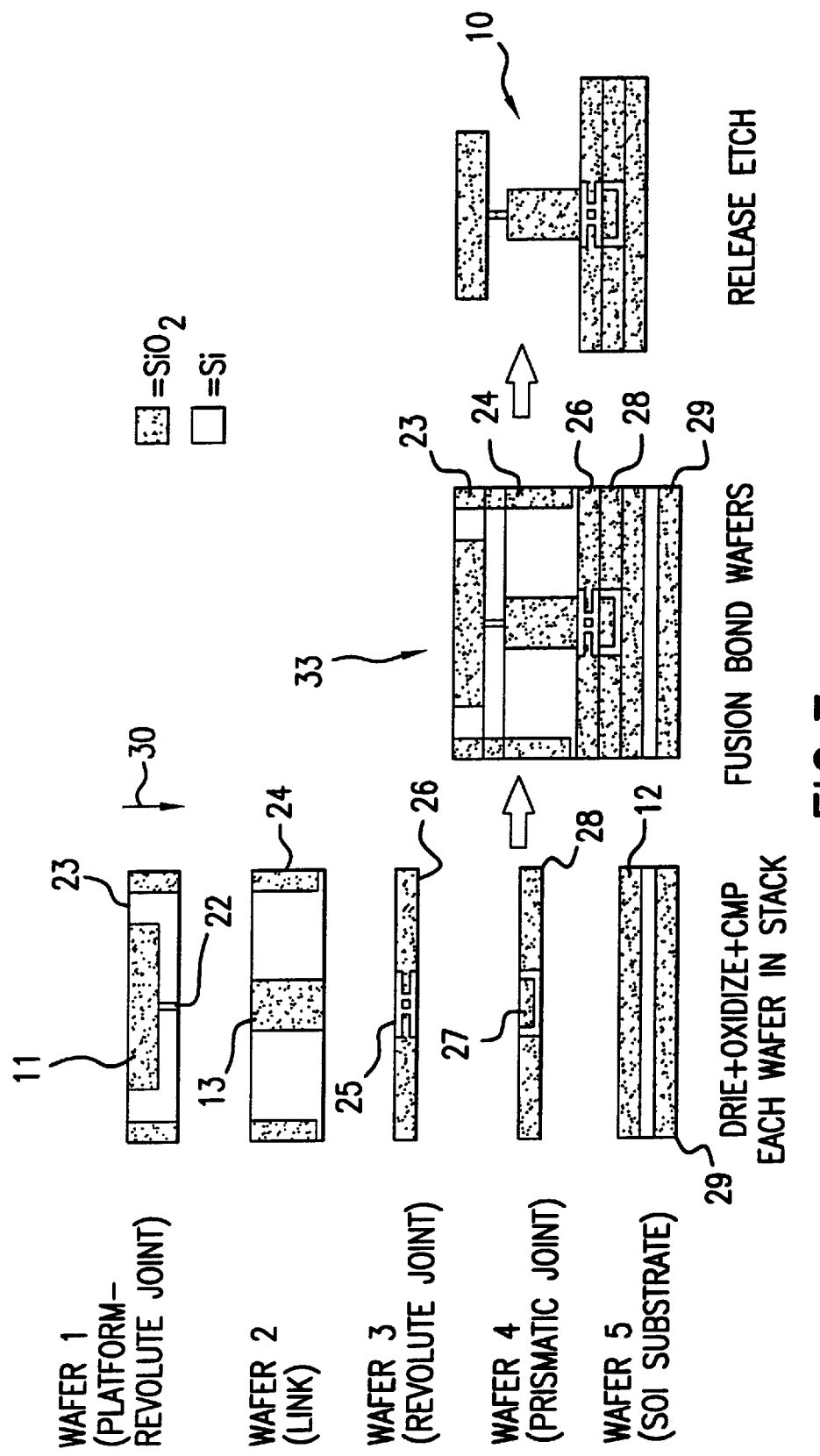
FIG. 7 shows in a simplified fashion a fabrication process of the present invention applied to a platform micromanipulator.

As shown in FIG. 7, the above-described techniques are used in the process of the present invention to fabricate a multi-DOF (degree-of-freedom) platform manipulator 10 of FIG. 1. The micromanipulator 10 includes the platform 11 and a revolute joint 22 to be created in a wafer 23, the link (limb) 13 to be created in a wafer 24, a revolute joint 25 to be created in a wafer 26, a prismatic joint 27 to be created in a wafer 38, and the fixed base 12 created in the SOI substrate 29.

Each wafer 23, 24, 26 and 28, is subjected to multi-stage DRIE etching process to form a 2–4 $\mu$m wide trench defining a desired in-plane structure (similar to the process described with reference to FIGS. 5–6). For example, to create the platform and revolute joint in the wafer 23, initially the etch advances in the direction 30 to etch the wafer 23 completely through to make the revolute joint 22. In the second etch, the trenches are terminated at the depth corresponding to the width of the platform 11. After the multi-stage DRIE step is performed on the wafer 23, the opened trenches are thermally oxidized to produce a solid piece of $SiO_2$ 20 defining the structural elements 11, 22 in order that the $SiO_2$ spans the full width and depth of the trenches to "fill" the "platform-and-revolute joint" structure.

The substrate 23 is then planarized by chemical-mechanical polishing, and the next wafer 24 is bonded to the surface of the wafer 23 and polished to the desired thickness. The DRIE and oxidation steps are repeated for this wafer 24, and the process repeats until all the wafers 26, 28 and 29 are complete. The top surface may be polished in preparation for any desired CMOS processing or polysilicon micromachining. The substrate 29 at this point contains only single-crystal silicon and thermal $SiO_2$, and thus does not restrict the thermal budget for CMOS process.

The multi-wafer stack structure 33 includes the 3-D micromechanism 10 enveloped therein. $SiO_2$ serves as matrices material to hold together the created delicate and freestanding portions of the micromechanism 10 during the manufacturing process. The micromechanism 10 is finally released from the multilayer structure 33 by $XeF_2$ etch of the unwanted Si.

In this manner, the 3-dimensional structures may be fabricated with a large range of x-y-z dimensions having. in-plane dimensions as small as 4 $\mu$m and out-of-plane dimensions ranging from approximately 5 to 50 $\mu$m, with structures of several millimeters possible for multi-layer devices. The technique is capable of producing integrated hub and axle type geometries similar to those achievable by assembly methods but in a fully parallel process. In addition, new geometries can be achieved in 3DMEMS structures, opening new categories of micromachined structures which cannot be achieved through other fabrication techniques.

A comparison of the 3DMEMS process with existing microfabrication techniques for 3-dimensional MEMS devices is shown in Table 2. From this table it can be seen that the 3DMEMS process of the present invention possesses all of the critical properties for fabricating 3-dimensional Microsystems. These properties include truly 3-D structures, a parallel fabrication process, integrated processing without the need for manual assembly, mainstream fabrication technology, potential for VLSI and surface-micromachined MEMS integration with the 3-D structures, and a large range of spatial motion. In addition to these capabilities, the 3DMEMS process allows for both "hub-and-axle" and "ball-and-socket" geometries.

TABLE 2

Comparison of 3-D Microfabrication Techniques

| Process Category | Technique | true 3D | parallel process | no manual assembly | std. fab | VLSI integ. | MEMS integ. | large xyz range | hub & axle | ball & socket |
|---|---|---|---|---|---|---|---|---|---|---|
| Serial | laser/ion etching | | | x | x | x | x | x | | |
| | laser deposition (LDVD) | x | | x | x | x | x | | | |
| | focused ion deposition | x | | x | x | x | x | | | |
| | micro stereo lithography | x | | x | | | | x | | |
| Assembled | component bonding | x | | | x | x | x | x | x | |
| | pick-and place | x | | | x | x | x | x | x | |
| | Hinged | x | x | | x | x | x | | | |

TABLE 2-continued

Comparison of 3-D Microfabrication Techniques

| Process Category | Technique | true 3D | parallel process | no manual assembly | std. fab | VLSI integ. | MEMS integ. | large xyz range | hub & axle | ball & socket |
|---|---|---|---|---|---|---|---|---|---|---|
| Parallel | bulk Si etched | | x | x | x | x | x | x | | |
| | deep-RIE | | x | x | x | x | x | x | | |
| | LIGA | | x | x | | x | x | x | | |
| | 3 DMEMS | x | x | x | x | x | x | x | x | x |

Figure 8:
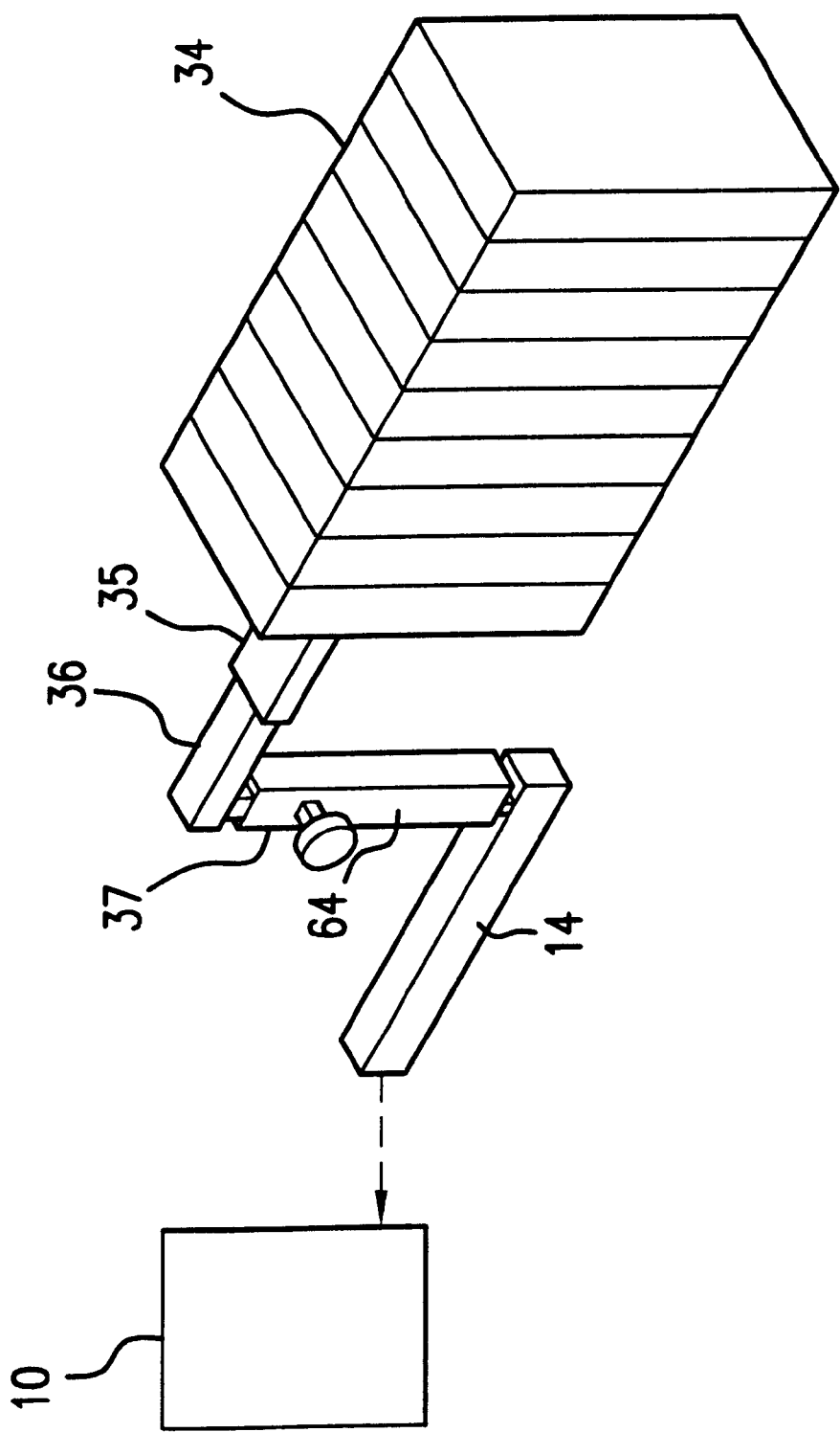
FIG. 8 is a perspective view of the mechanical amplification system for coupling a piezoelectric actuator to a micromanipulator made by the 3DMEMS process of the present invention.

By use of the present invention technique, it is possible to produce a high-precision micropositioner with a 500 μm×500 μm×500 μm or larger work space. Various actuation methods for the fabrication micromechanism can be employed including pneumatic, hydraulic, piezoelectric, magnetic, and electrostatic actuation. One concept employing an off-chip piezoelectric actuator is depicted in FIG. 8. In this approach, a commercially available piezoelectric stack actuator 34 is fixed to an input linkage 35 fabricated in the 3DMEMS process. The input linkage 35 is connected to a micromachined lever 36 attached to the substrate by-torsional flexures 37.

These flexures act as revolute joints to provide the -mechanical advantage for the lever 36. Using a compact piezoelectric stack actuator 34, such as Piezo Systems' 5 mm wide TS18-HS-104 transducer, small input deflections from angstrom resolution to 10 μm may be converted into larger deflections of the actuation slide 14 while simultaneously retaining high actuation force and nanometer positioning resolution at the output.

While the input linkage 35 shown in FIG. 8 seems to add significant complexity to the device, the complexity is shifted from costly mechanism fabrication as is the case for traditional serial manufacturing techniques, to mechanism design, since the linkage is produced in parallel with the platform manipulator 10 without additional steps in the process. This is an important advantage of the fabrication process of the present invention and highlights the importance of parallel manufacturing technology for complex mechanisms.

Figure 9:
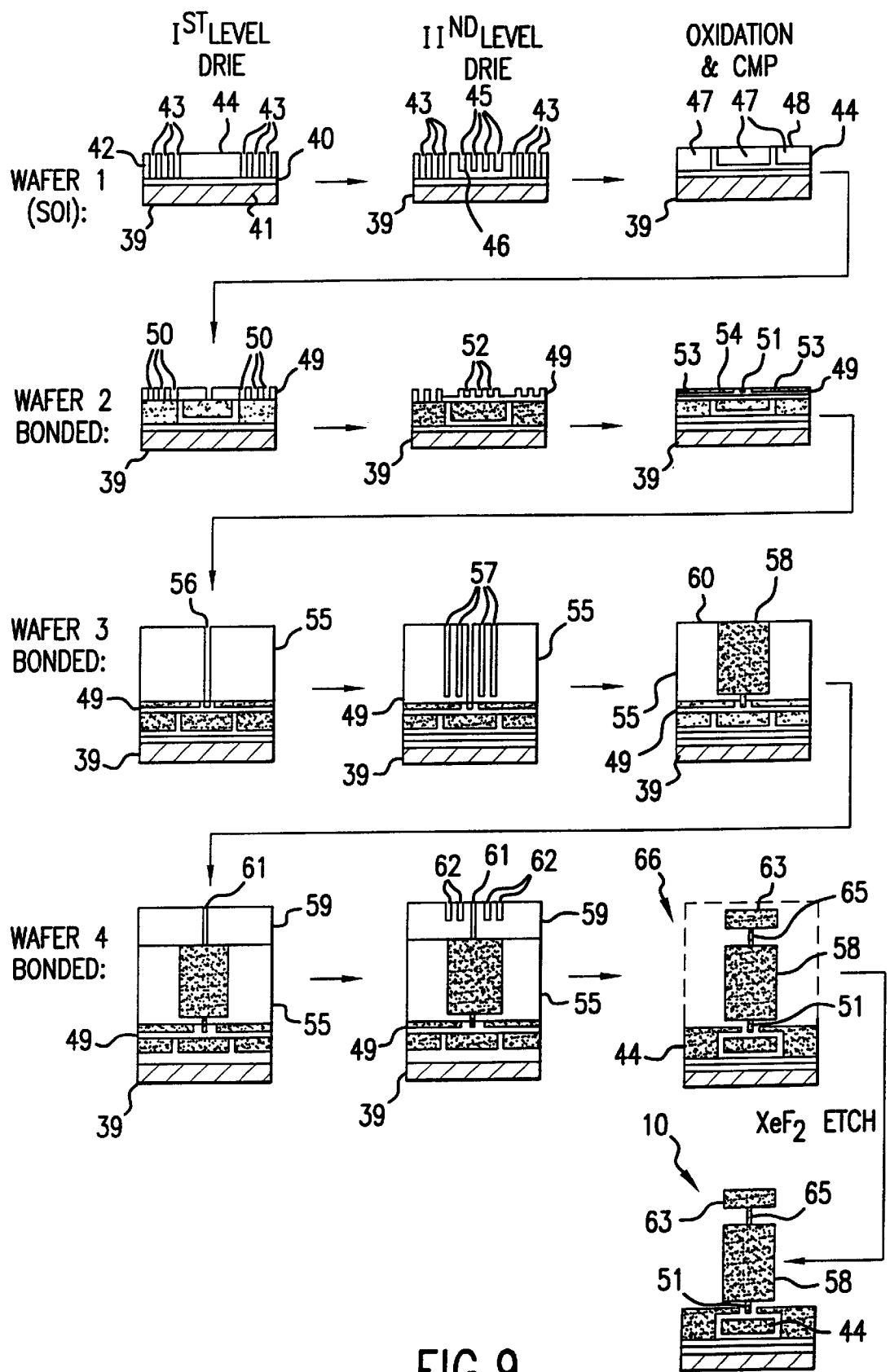
FIG. 9 shows schematically a 3DMEMS process of the present invention for forming the platform manipulator of FIG. 1.

The fabrication process used for manufacturing the platform micromanipulator described in FIG. 8 in parallel with the actuation linkage 35 is shown in FIG. 9. The process requires eight etch steps, four wafer bondings, and four oxidations to form the micromanipulator and differs from the process shown in FIG. 7 by illustrating the same in more detailed fashion and in a slightly alternative version.

Referring to FIG. 9, the initial wafer 39, which is a SOI substrate, having a $SiO_2$ layer 14 sandwiched between bottom silicon layer 41 and top silicon layer 42 is subjected to a first level DRIE step in which a plurality of through trenches 43 of 2–4 micron width are formed within the top silicon layer 42. The etching process is ended by the $SiO_2$ layer 14. In this step, the structure 44 (a prismatic joint) is outlined externally by the trenches 43.

In the next step, which is second level DRIE process, the trenches 45 are formed inside the structure 44. The trenches 45 are etched to the silicon layer 42 and are ended above the $SiO_2$ layer 14 to define a bottom 46 of the prismatic joint 44.

Subsequently, an oxidation of the DRIE etched trenches 43 and 45 is performed to produce a solid piece of $SiO_2$ which completely fills the full width and depth of the trenches 43 and 45 thus defining the structure 44 by enveloping the same from the outside and filling the same from the inside thereof. The thermally grown $SiO_2$ block 47 completely fills the trenches 43 and 45 with the fronts of the thermally grown $SiO_2$ meeting above the tops of the trenches to form a single continuous block of $SiO_2$ defining the shape of the structure 44.

After the thermal oxidation has been completed, a post-deposition chemical mechanical polishing step is performed to planarize and smooth the top surface 48 of the wafer 39.

In a further step, the wafer 49 is bonded by means of a high temperature silicon-to-silicon hydrophobic or hydrophilic fusion bonding technique to the planarized top surface 48 of the processed wafer 39. The wafer 49 is polished to the desired thickness, and the first level DRIE step is performed in which trenches 50 of 2 micron width and spaced 2 microns apart each from the other are etched through the wafer 49 to "open" a structure 51 which is a revolute joint located centrally of the wafer 49. In the second level DRIE following the first level DRIE, trenches 52 are opened surrounding the structure 51. The trenches 52 do not pass through the full width of the wafer 49 but end a predetermined distance from the bonding surface between the wafer 49 and the wafer 39.

In the next step, thermal oxidation of the trenches 50 and 52 takes place in which a single block 53 of the $SiO_2$ filling the trenches 50 and 52 is formed.

After the thermal oxidation, the post-deposition mechanical polishing step planarizes the surface 54 of the wafer 49. As can be seen, the wafer 49 is processed to form a revolute joint 51 bonded in 3-dimensional fashion to the prismatic joint 44 fabricated in the initial wafer 39.

Further, a wafer 55 is bonded by means of a high temperature silicon-to-silicon hydrophobic or hydrophilic fusion bonding technique to the top surface 54 of the processed wafer 49. The wafer 55, similar to the wafers 39 and 49 is subjected to a two stage DRIE etching process.

In the first level DRIE step, a trench 56 of 2 micron width is etched through the wafer 55. In the second level DRIE step, trenches 57 of 2 micron widths with 2 mm spacing therebetween are etched. The trenches 57 are ended several microns from the bonding surface between the wafers 55 and 49.

The trenches 56 and 57 are then thermally oxidized to form a continuous single $SiO_2$ block 58 forming a linkage structure 35 of the mechanical amplification system shown in FIG. 8. The wafer 55 is then planarized by chemical mechanical polishing and the next wafer 59 is bonded by means of a high temperature silicon-to-silicon fusion bonding technique to the top surface 60 of the wafer 55.

In a similar manner to the wafers 39, 49 and 55 the wafer 59 goes through two stage DRIE etching steps. In the first level DRIE process, a trench 61 is etched through the wafer 59 and in the second level DRIE step trenches 62 are etched, which are ended prior to reaching the underlying wafer 55. The trenches 61 and 62 are then thermally oxidized to fill them with the solid SiO$_2$ block 63 thus forming a structure which may constitute either a platform 11 of the micromechanism shown in FIG. 1, or mechanical amplification structure 64 of FIG. 8 operatively coupled between the linkage 35 and the actuation slider 14. As can be seen a revolute joint structure 65 is fabricated in the wafer 59 which constitutes either the joint 15 of the micromechanism shown in FIG. 1, or a pseudo-revolute joint 37 of the mechanism shown in FIG. 8.

The upper-most surface of the structure 64 may then be polished for possible end use as a substrate for further deposition of CMOS structures thereon. After all wafers have been processed in sequence, the multi-layer formation 66 is obtained with the 3-dimensional microstructure embedded therewithin. The unwanted Si of the multilayer structure 66 is etched in XeF$_2$ solution and the micromechanism is released.

Figure 10:
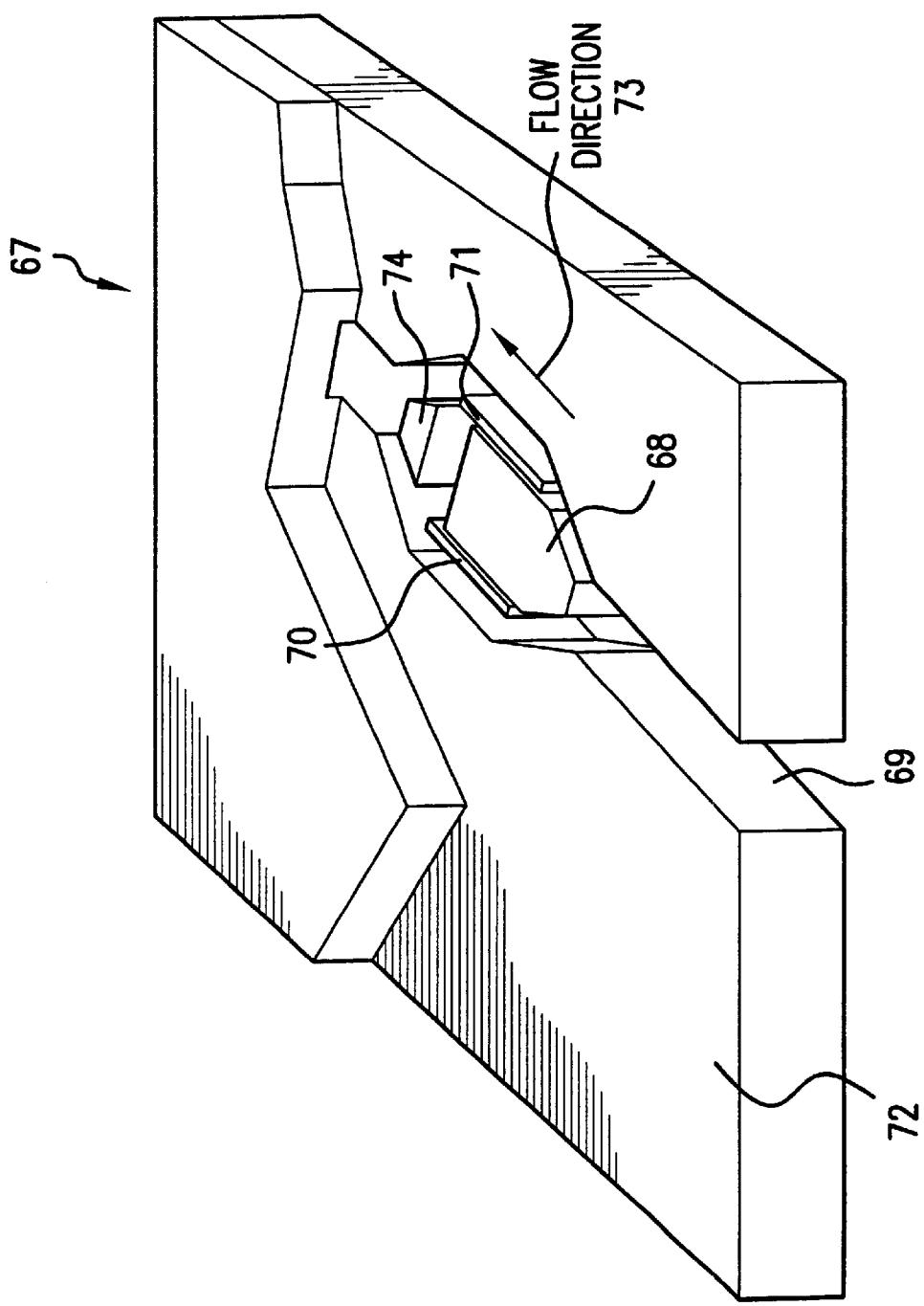
FIG. 10 shows a microfluidic check valve created by the 3DMEMS process of the present invention.

In addition to the spatial micromechanism described in previous paragraphs, a microfluidic system containing vertical and horizontal passageways, chambers, and sliding check-valves may be fabricated in the 3DMEMS process of the present invention. An integrated check-valve 67 shown in FIG. 10, demonstrates the ability of the 3DMEMS process of the present invention to produce enclosed components such as the sliding plug 68. More importantly, it enables the fabrication of microfluidic systems with integrated check valves, sliding gate valves, 3-dimensional fluid passageways with complex interconnections between various levels, and fluidic devices with arbitrary input and output ports on the top, sides, and bottom of the fluid chip.

The integrated check-valve 67 includes a sliding plug 68 positioned in the flow path 69 which slides between "open" and "close" positions in order to allow passage or interrupt the flow of a liquid. The sliding plug 68 slides between two lateral plug guides 70 and 71 and is freely displaceable in order to permit a smooth movement between "close" and "open" positions.

Figure 11:
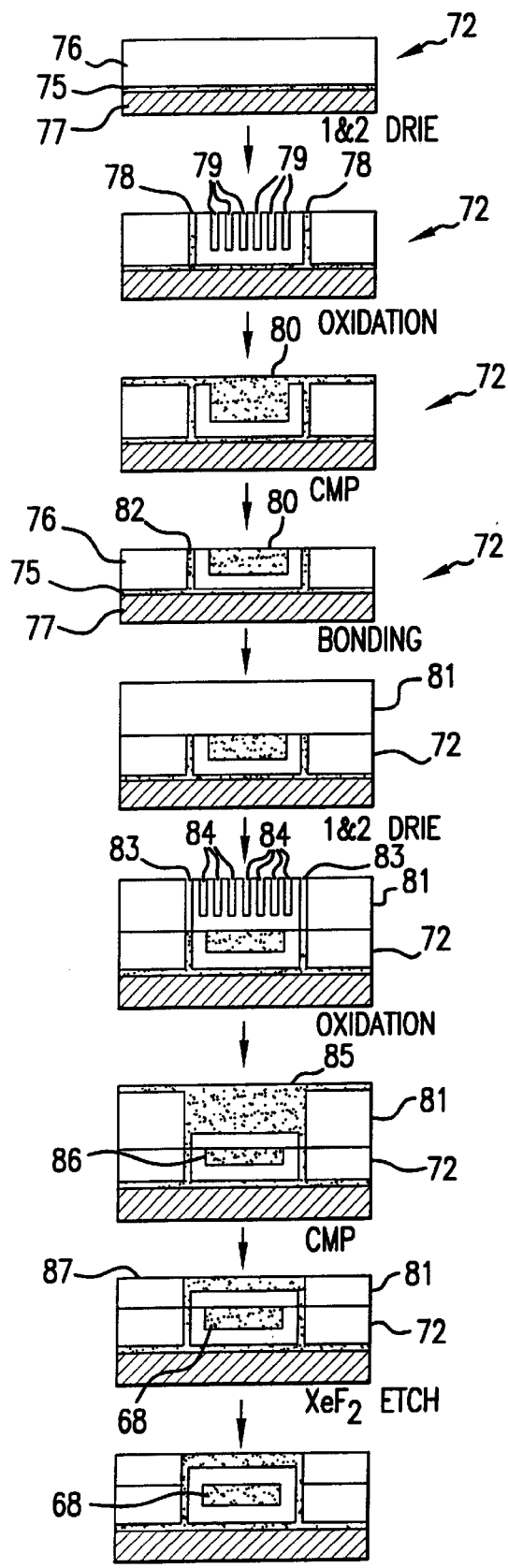
FIG. 11 shows schematically an example of the 3DMEMS fabrication process of the present invention applied to a microfluidic channel of FIG. 10.

The flow passage (or the fluidic channel) 69 is defined in the SOI wafer 72 to permit flow of a fluid therealong. When the liquid flows in the direction 73, the plug 68 moves in the direction of the flow and is terminated by a plug stop 74 in the "open" position of the valve 67. In order to prevent the fluid from moving opposite to the desired flow direction 73, the plug 68 moves in the direction opposite to the flow direction 73, closes the passage 69 and thus interrupts the unwanted flow of the liquid along the fluidic channel 69. The fabrication process applied to the microfluidic check-valve 67 is shown in FIG. 11.

In this process flow, the starting material is a commercially-available SOI wafer 72. The SOI wafer 72 includes a SiO$_2$ layer 75 sandwiched between two silicon layers 76 and 77. The thickness of the top silicon layer 76 is chosen for a desired application. In this case by the specified thickness of the microfluidic passage 69. Deep reactive ion etching (DRIE) is performed on the SOI wafer starting substrate 72 in two steps.

In the first etch, 4 $\mu$m wide trenches 78 are etched down to the oxide layer 75 of the SOI wafer 72. In the second etch, a series of 4 $\mu$m wide trenches 79 spaced 2 $\mu$m apart are patterned by a timed DRIE etch. The geometric tolerances in this second etch will depend on the uniformity and etch rate controllability which can be achieved for the DRIE etch.

Trenches 78 and 79 are then thermally oxidized to produce a solid piece 80 of SiO$_2$ which spans the full width of the trenches. The substrate 72 is then planarized by CMP, and a second wafer 81 is bonded to the surface 82 of the wafer 72 and polished back to the desired thickness of the next layer. The DRIE and oxidation steps are repeated for this new layer 81.

In the first DRIE etch, the trenches 83 are etched completely through the width of the wafer 81 and end on the buried oxide 80 of the wafer 72. In the second DRIE etch, trenches 84 are etched with etching timed to stop before reaching the oxide layer 80. After the DRIE etching is completed., the trenches 83 and 84 are filled using thermal oxidation, thus forming a SiO$_2$ block 85 outlining and enveloping the structure 86 which is a sliding plug 68 capable of sliding within the flow passage 69.

The top surface 83 of the processed wafer 81 is polished to the desired thickness in preparation for any required CMOS processing or polysilicon micromachining. The substrate at this point contains only single-crystal silicon and thermal SiO$_2$, and thus does not restrict the thermal budget for CMOS processing. After CMOS fabrication and passivation, etch holes are opened in the fluidic passageway, and XeF$_2$ is used to gently remove the single crystal silicon from the passage.

As one of the embodiments of the 3DMEMS technology of the present invention, a "planar process" has been developed. The primary advantages of this process are (1) excellent out-of-plane geometric control, (2) only 2 wafers are required to achieve spatial microactuators with three or more degrees of freedom, and (3) wafer-to-wafer alignment is not required.

Figure 12:
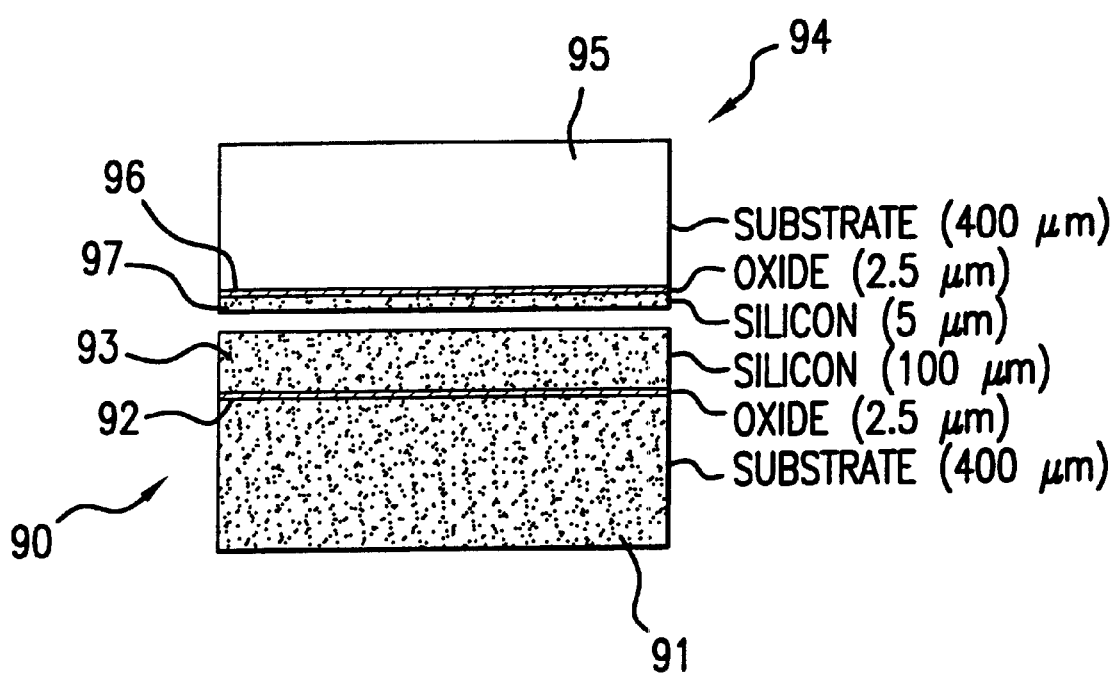
FIG. 12 shows schematically wafer configuration for the 3DMEMS planar process of the present invention.

In the planar process, the 3-D platform mechanisms are fabricated using two SOI wafers (shown in FIG. 12) commercially available from Shin-Etsu Company. The first wafer 90 consists of a 400 $\mu$m silicon substrate 91, a 2.5 $\mu$m Si oxide layer 92, and a 100 $\mu$m active silicon layer 93. This wafer 90 is constructed by growing an oxide layer on the substrate and bonding another silicon wafer on the top. The correct thickness is obtained by chemical-mechanical polishing (CMP). The first wafer 90 is used to form the sliders, platform, and guides. The second wafer 94 consists of a 400 $\mu$m silicon substrate 95, a 2 $\mu$m Si oxide layer 96, and a 5 $\mu$m silicon layer 97. The active layer 97 of the second wafer is bonded to 100 $\mu$m active layer 93 of the first wafer 90 to form the out-of-plane joints and cap of the sliders.

A series of RIE, DRIE, and bonding steps are used to shape the sliders, guides, platform, and caps. The last step is an HF oxide etch which releases the sliders.

Figure 13:
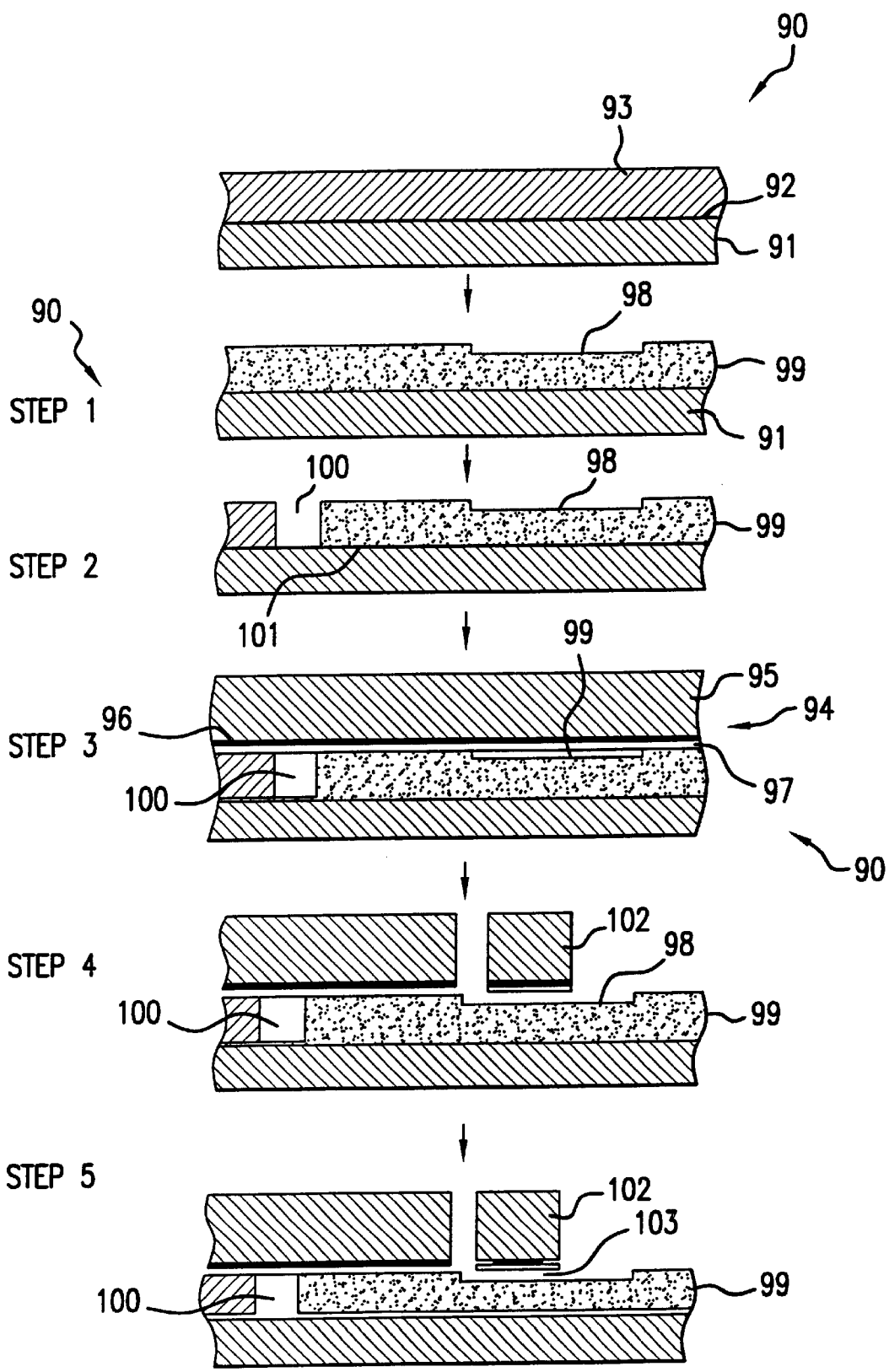
FIG. 13 shows schematically the fabrication process flow for the 3DMEMS planar process of the present invention.
Figure 14:
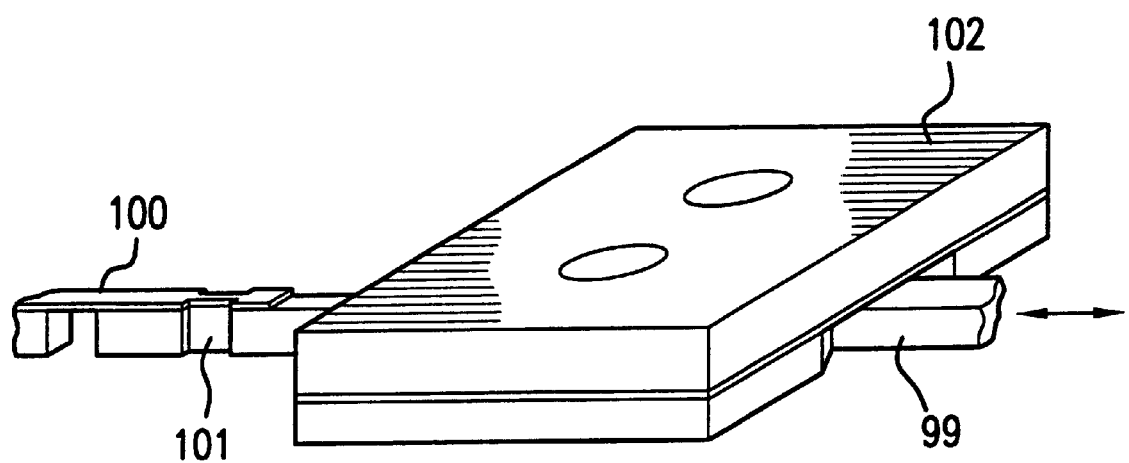
FIG. 14 is a perspective view of a micromechanism component fabricated by the 3DMEMS planar process of the present invention (the component includes an in-plane compliant revolute joint, out-of-plane compliant revolute joint, and a slider (an in-plane prismatic joint).

The fabrication steps of the 3DMEMS planar process and a conceptual schematic of a micromechanism component including an in-plane compliant revolute joint, out-of-plane compliant revolute joint, and an in-plane prismatic joint (slider) fabricated using the planar process are illustrated in FIGS. 13 and 14. In step 1, RIE is used to etch a small (e.g., 2 $\mu$m) clearance 98 in the layer 93 so that the top of the slider 99 does not bond to the second wafer 94 in step 3. Step 2 is a deep reactive ion etch completely through the layer 93 of the first wafer 90 for forming an out-of-plane joint area 100. The shape of the in-plane joint 101 is defined by the mask. A 2 $\mu$m gap is etched between the slider and the guides to allow slider motion. The second wafer 94, which is used for both the out-of-plane joint and the slider cap 102, is bonded to the first wafer 90 in step 3. In step 4, the entire second wafer 94 is etched completely away around the slider 99 via DRIE. Additionally, a gap 103 is etched between the slider 99 and the cap 102 to allow slider motion. In the last step 5, a timed oxide etch is performed to release the slider. It is necessary for the cap and guides to be much larger than the released structures so that they remain anchored to the substrate of the first wafer. Alignment between wafers is achieved by pre-etching successively larger DRIE alignment holes in the periphery of each wafer, allowing direct topside optical alignment without the need for an IR alignment system or wafer-to-wafer alignment during the bonding process.

As described, the proposed 3DMEMS fabrication process offers novel approaches to micromechanism manufacture. With this process, nearly arbitrary in-plane and out-of-plane shapes maybe produced. They are fully parallel, allowing for the integration of both VLSI circuitry and traditional surface-micromachined devices onto the mechanical structure. The 3-dimensional structures can be fabricated with a large range of x-y-z dimensions, with in-plane dimensions as small as 4 μm and out-of-plane dimensions ranging from approximately 5 to 50 μm, with structures of several millimeters possible for multilayer devices. The techniques are capable of producing integrated hub-and-axle geometries similar to those produced by micro-scale assembly methods however without the need for hand assembly. The technology allows the fabrication of a class of micromachined structures which have not currently been achieved.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A method of fabrication of 3-dimensional micromechanisms having at least a first and a second structural elements operatively coupled therebetween in a predetermined structural arrangement, the method comprising the steps of:
   (a) providing a first wafer,
   (b) etching said first wafer to form first trenches defining said first structural element of the 3-dimensional micromechanism,
   (c) oxidizing surfaces of said first trenches,
   (d) providing a second wafer,
   (e) bonding said second wafer to a respective surface of the processed said first wafer thereby forming a multi-layer formation,
   (f) etching said second wafer to form second trenches defining said second structural element of the 3-dimensional micromechanism, said second structural element being in predetermined mutual disposition with respect to said first structural element,
   (g) oxidizing surfaces of said second trenches, and
   (h) etching said multi-layer formation to release said 3-dimensional micromechanism therefrom.

2. The method of claim 1, wherein at least one of said first and second structural elements is formed from. material including $SiO_2$.

3. The method of claim 1, wherein said 3-dimensional micromechanism includes a plurality of the structural elements operatively coupled therebetween, said method further comprising the steps of:
   providing a plurality of wafers, and
   after the step (c), repeating the steps (e)–(g) for said plurality of the wafers in a predetermined sequence thereby creating said multi-layer formation with each of said plurality of structural elements defined in a respective layer of said multi-layer formation.

4. The method of claim 1, wherein said first wafer includes a silicon-on-insulation substrate.

5. The method of claim 1, wherein said second wafer includes a silicon-on-insulation wafer.

6. The method of claim 1, wherein said second wafer includes a silicon wafer.

7. The method of claim 1, wherein in said steps (b) and (f), said etching is performed by means of deep reactive ion etching (DRIE) techniques.

8. The method of claim 7, further comprising the steps of multi-stage deep reactive ion etching forming said first and second trenches of different depths.

9. The method of claim 1, wherein the width of said first and second trenches varies in the approximate range of 2–4 μm.

10. The method of claim 1, wherein said trenches are spaced approximately 2 μm–4 mm apart each from the other.

11. The method of claim 1, further comprising the step of thermal oxidation of the surfaces of said first and second trenches thereby growing $SiO_2$ therewithin.

12. The method of claim 4, wherein in said steps (c) and (g), said first and second trenches are substantially filled with $SiO_2$ thereby forming a continuous $SiO_2$ block defining said first and second structural elements of said 3-dimensional micromechanism, said $SiO_2$ block holding said first and second structural elements in said predetermined structural disposition therebetween.

13. The method of claim 1, wherein in said steps (b) and (f), said wafers are etched through a Si bulk portion thereof.

14. The method of claim 1, further comprising the steps of:
   after said steps (c) and (g), planarizing an open surface of the processed wafer.

15. The method of claim 14, further comprising the step of planarizing said open surface of the processed wafer by means of chemical-mechanical polishing technique.

16. The method of claim 1, further comprising the steps of:
   subsequent to step (e), thinning said second wafer to a predetermined thickness thereof.

17. The method of claim 1, further comprising the steps of:
   in said step (h) etching said multi-layer formulation in gas-phase $XeF_2$ to remove unwanted areas thereof and leaving selected Si and $SiO_2$ structures forming said 3-dimensional micromechanism.

18. The method of claim 3, wherein said structural elements of said 3-dimensional micromechanism include elements chosen from the groups consisting of: actuators, actuatable structures, links therebetween, embedded kinematic pairs, and compliant and non-compliant joints.

19. The method of claim 1, wherein in said step (e), said bonding is a hydrophobic bonding.

20. The method of claim 1, wherein in said step (e), said bonding is a hydrophilic bonding.

* * * * *